(12) United States Patent
Hirakawa

(10) Patent No.: US 6,304,114 B1
(45) Date of Patent: Oct. 16, 2001

(54) MODE SETTING DETERMINATION SIGNAL GENERATION CIRCUIT

(75) Inventor: Tsuyoshi Hirakawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/532,236

(22) Filed: Mar. 22, 2000

(30) Foreign Application Priority Data

Mar. 26, 1999 (JP) .................................................. 11-084080

(51) Int. Cl.[7] ....................................................... H03L 7/00
(52) U.S. Cl. ............................................ 327/143; 327/198
(58) Field of Search .................................... 327/143, 198, 327/215, 218, 219, 299

(56) References Cited

U.S. PATENT DOCUMENTS 5,767,717 * 6/1998 Schorn et al. ........................ 327/210

* cited by examiner

*Primary Examiner*—Terry D. Cunningham
*Assistant Examiner*—Quan Tra

(74) *Attorney, Agent, or Firm*—Scully, Scott, Murphy & Presser

(57) ABSTRACT

The present invention provides a mode setting determination signal generation circuit for generating a mode setting determination signal based on a power-on signal applied during power-up, including signal generation means for generating an output signal fixed either to a high or low level, a first logic circuit section for outputting a signal based on a NOR or OR logic between the output signal from the signal generation means and the power-on signal, a second logic circuit section for outputting a signal based on a NAND or AND logic between a power-on signal having a polarity opposite to that of the power-on signal and the output signal from the signal generation means, a third logic circuit section for outputting a signal based on a NAND or AND logic between a signal at a mode setting determination signal output terminal thereof and the output signal from the second logic circuit section, a transfer gate circuit section for outputting either the output signal from the third logic circuit section or a mode setting signal as an output signal based on a mode setting control signal, and a fourth logic circuit section for outputting a signal based on a NAND or AND logic between the output signal from the transfer gate circuit section and the output signal from the first logic circuit section.

8 Claims, 8 Drawing Sheets

MODE SETTING DETERMINATION SIGNAL DURING POWER-UP

| | p1 | p2 | p3 | p4 |
|---|---|---|---|---|
| ION INJECTED? | YES ON | NO OFF | NO OFF | YES ON |
| | NO OFF | YES ON | YES ON | NO OFF |

⇒ B SIGNAL=H  
   C SIGNAL=L ⇒ MODE SETTING DETERMINATION SIGNAL=L

⇒ B SIGNAL=H  
   C SIGNAL=L ⇒ MODE SETTING DETERMINATION SIGNAL=H

MODE SETTING DETERMINATION SIGNAL GENERATION CIRCUIT

BACKGROUND OF THE INVENTION

1. Field of the Invention

The present invention relates to a mode setting determination signal generation circuit, and in particular, to a memory circuit for generating, during power-up, a mode setting determination signal indicating an initial setting for an operation mode.

2. Description of the Prior Art

Memory devices require an initial setting for their operation mode to be determined during power-up. Thus, the memory device requires a circuit for generating a mode setting determination signal indicating the initial setting for the operation mode.

FIG. 8 shows a conventional mode setting determination signal generation circuit. This circuit is comprised of a NAND circuit 100, inverters (NOT circuits) 101, 102, and transfer circuits (transfer-gates) 103, 104.

A POWER-ON signal with negative logic (an output signal from such a circuit as generates a one-shot pulse on power-up. This signal is hereafter referred to as a "POWER-ON signal bar") is input to one input terminal of the NAND circuit 100, while output signals from the transfer circuits 103, 104 are input to the other input terminal thereof.

An output signal from the NAND circuit 100 is input to the inverter 101, while a mode setting control signal is input to the inverter 102. A mode setting determination signal serves to select an operation mode of the device. An output terminal of the inverter 101 is connected to a source of the transfer circuit 103. The mode setting control signal is applied to a first circuit of the transfer circuit 103, and an output terminal of the inverter 102 is connected to a second circuit thereof. A mode setting signal is applied to a source of the transfer circuit 104. The output terminal of the inverter 102 is connected to a first circuit of the transfer circuit 104, and the mode setting control signal is applied to a second circuit thereof.

Drains of the transfer circuits 103 and 104 are both connected to the other input terminal of the NAND circuit 100.

With this configuration, during power-up, the operation mode is set based on the POWER-ON bar signal (the mode setting determination signal is sent out). First, a mode setting signal applied to the transfer circuit 104 is set to an H level. The applied mode setting signal at the H level is then applied to the other input terminal of the NAND circuit 100 through the transfer circuit 104. When a POWER-ON signal bar (L level) is applied to one input terminal of the NAND circuit 100, the output terminal of the NAND circuit 100 is set to the H level. This signal acts as a mode setting determination signal.

FIG. 9 shows another conventional mode setting determination signal generation circuit. This semiconductor storage is comprised of a NOR circuit 110, inverters 111, 112, and transfer circuits 113, 114.

The semiconductor storage in FIG. 9 will have the same overall configuration as the circuit in FIG. 8 if the NAND circuit 100 in FIG. 8 is replaced with the NOR circuit 110. That is, the inverters 111, 112 correspond to the inverters 101, 102, and the transfer circuits 113, 114 correspond to the transfer circuits 103, 104.

With the configuration in FIG. 9, during power-up, a POWER-ON signal (H level) sets the operation mode of the circuit. First, a mode setting signal applied to the transfer circuit 104 is set to the H level. In this semiconductor device, the H-level POWER-ON signal is applied to the NOR circuit 110 and to the other input terminal of the NAND circuit 100 through the transfer circuit 104. The NOR circuit 110 outputs an L-level signal when both input terminals thereof are at the L level. Consequently, when the mode setting signal is at the H level, an L-level mode setting determination signal is output.

In FIGS. 8 and 9, once the output of the NAND circuit 100 or NOR circuit 110 has been set to the L level, the corresponding data is latched in the path between the NAND circuit 100 and the inverter 101 or between the NOR circuit 110 and the inverter 111. As described above, the operation mode is set to the single value during power-up.

In addition, in FIGS. 8 and 9, to change the setting for the operation mode after power-up, an externally provided mode setting control signal is shifted from H to L level. Then, the transfer circuit 103, 113 is turned off and the transfer circuit 104, 114 is turned on to change the setting for the operation mode.

According to the conventional circuit, however, the setting (mode setting determination signal) for the operation mode is determined simply by the POWER-ON signal during power-up, so that the operation mode can be set only to the H or L level. Although users have recently demanded various initial settings for the operation mode during power power-up, the conventional mode setting determination signal generation circuit cannot deal with such a demand.

BRIEF SUMMARY OF THE INVENTION

Objects of the Invention

It is an object of the present invention to provide a mode setting determination signal generation circuit capable of making a plurality of initial settings for the operation mode during power-up.

SUMMARY OF THE INVENTION

The present invention provides a mode setting determination signal generation circuit for generating a mode setting determination signal based on a power-on signal applied during power-up, comprising:

signal generation means for generating an output signal fixed either to a high or low level, a first logic circuit section for outputting a signal based on a NOR or OR logic between the output signal from the signal generation means and the power-on signal, a second logic circuit section for outputting a signal based on a NAND or AND logic between a power-on signal having a polarity opposite to that of the above power-on signal and the output signal from the signal generation means, a third logic circuit section for outputting a signal based on a NAND or AND logic between a signal at a mode setting determination signal output terminal thereof and the output signal from the second logic circuit section, a transfer gate circuit section for outputting either the output signal from the third logic circuit section or a mode setting signal as an output signal based on a mode setting control signal, and a fourth logic circuit section for outputting a signal based on a NAND or AND logic between the output signal from the transfer gate circuit section and the output signal from the first logic circuit section.

The signal generation means has a first transistor and a second transistor connected in series between a first power supply and a second power supply, and the first and second transistors have different voltage thresholds.

Ions are injected either into the first or second transistor to vary the voltage threshold of this transistor.

BRIEF DESCRIPTION OF THE DRAWINGS

The above-mentioned and other objects, features, and advantages of this invention will become more apparent by reference to the following detailed description of the invention taken in conjunction with the accompanying drawings, wherein.

DETAILED DESCRIPTION OF THE INVENTION

Embodiments of the present invention will be described with reference to the drawings.

Figure 1:
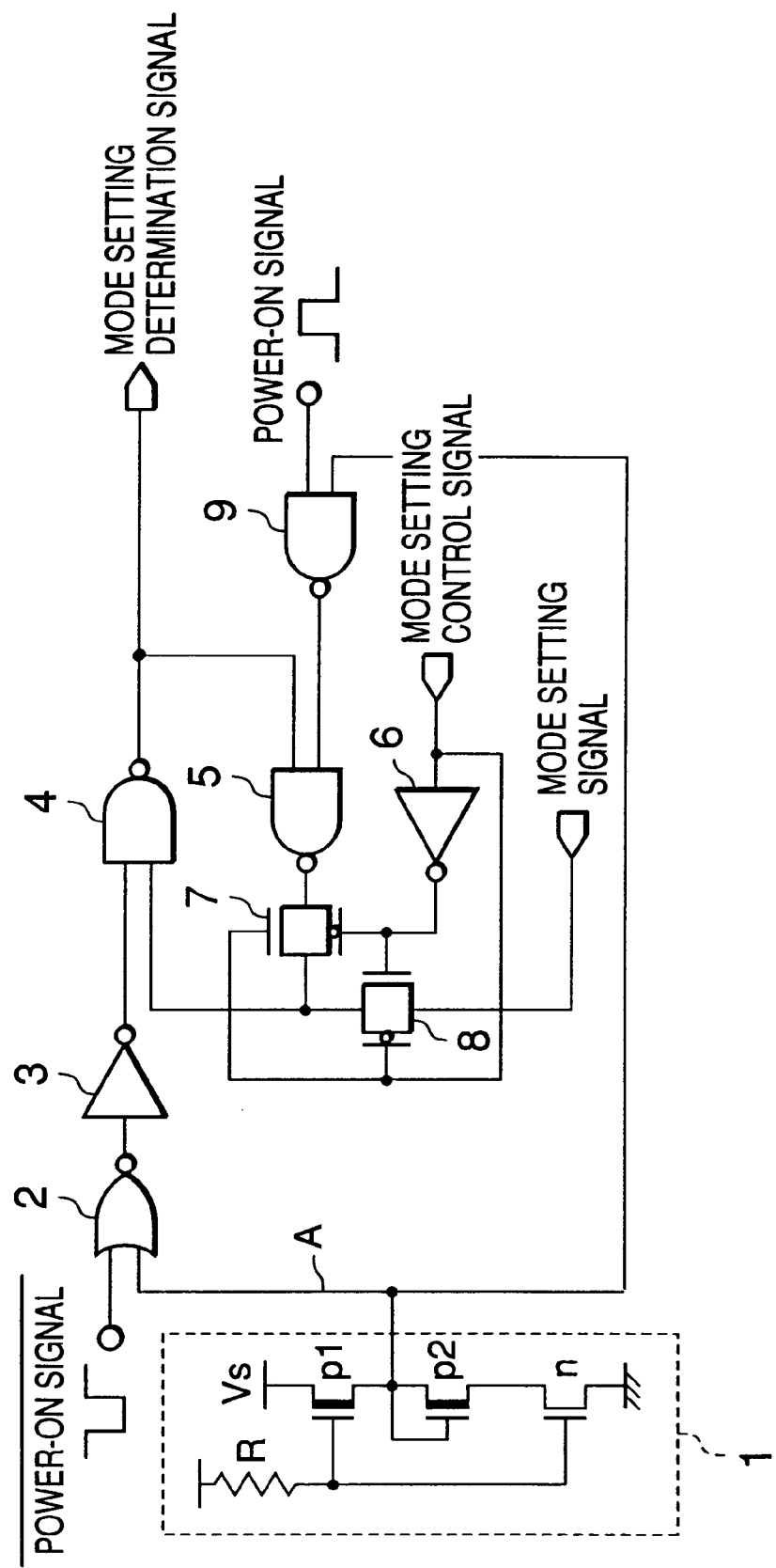
FIG. 1 is a circuit diagram showing a first embodiment of a mode setting determination signal generation circuit according to the present invention.

FIG. 1 shows a first embodiment of a semiconductor storage according to the present invention.

The semiconductor storage according to the present invention is comprised of a signal generation circuit 1, a NOR circuit 2, an inverter 3, NAND circuits 4, 5, an inverter 6, transfer circuits 7, 8, and a NAND circuit 9.

A POWER-ON signal with negative logic (POWER-ON signal bar) is input to one input terminal of the NOR circuit 2, while an output signal from the signal generation circuit 1 is input to the other input terminal thereof. An input terminal of the inverter 3 is connected to an output terminal of the NOR circuit 2, and one input terminal of the NAND circuit 4 is connected to an output terminal of the inverter 3.

An output terminal of the NAND circuit 4 outputs a mode setting determination signal. A POWER-ON signal with positive logic is input to one input terminal of the NAND circuit 9, while an output signal from the signal generation circuit 1 is input to the other input terminal thereof. One input terminal of the NAND circuit 5 is connected to an output terminal of the NAND circuit 9, and the other output terminal of the NAND circuit 5 is connected to the output terminal of the NAND circuit 4.

A source of the transfer circuit 7 is connected to an output terminal of the NAND circuit 5, and a drain of the transfer circuit 7 is connected to the other input terminal of the NAND circuit 4. A mode setting control signal is input to one circuit of the transfer circuit 7, while an output terminal of the inverter 6 is connected to the other circuit of the transfer circuit 7.

In addition, a mode setting signal is input to a source of the transfer circuit 8, and a drain thereof is connected to the other input terminal of the NAND circuit 4. One circuit of the transfer circuit 8 is connected to the output terminal of the inverter 6, while the mode setting control signal is input to the other circuit thereof.

The signal generation circuit 1 is comprised of a P channel transistors p1, p2 inserted between a power supply VS and a ground in a fashion being connected in series, an N channel transistor n, and a resistor R connected between the power supply VS and the circuit of the transistor p1. A drain of the transistor p1 and the circuit of the transistor p2 are connected together while the circuit of the transistor p1 and the circuit of the transistor n are connected together so that the drain of the transistor p1 acts as an output terminal to output an output signal A.

In this signal generation circuit 1, when ions are injected either into the transistor p1 or p2, the VT (threshold voltage) for this transistor varies to enable the setting for an operation mode to be changed during power-up. Subsequently, by externally varying the mode setting signal, the operation mode can be changed to different modes.

Next, the operation of the semiconductor storage in FIG. 1 will be explained. Ions are injected either into the P channel transistor p1 or p2 of the signal generation circuit to vary its VT, and the threshold is fixed once an output signal A has reached a desired value on the H level (or L level).

Thus, the mode setting determination signal output from the NAND circuit 4 is set to the H level (or L level). The POWER-ON signal bar is supplied by such a circuit as generates a one shot pulse during power-up. In addition, the mode setting determination signal is at the H or L level, by which the operation mode of the device can be selected. Further, the mode setting control signal is set to the L level if the operation mode is to change after power-up. If this changing is to be carried out, inputting an H-level mode setting signal sets the mode setting determination signal to the L level, whereas inputting an L-level mode setting signal sets the mode setting determination signal to the H level. An operation of the device will be described which is performed if the output signal A is set to the H or L level after power-up.

First, it is assumed that the output signal A from the signal generation circuit 1 is at the H level, that is, that ions are injected only into the transistor p1. In this case, the transistor p1 is turned on, while the transistor p2 is turned off, thereby setting the output signal A to the H level. The H-level output signal A is input to the NOR circuit 2, which then outputs an L-level signal to set the output of the inverter 3 to the H level.

Normally, the H-level output signal A and the POWER-ON signal are input the NAND circuit 9, which then outputs an H-level signal, thereby turning on the transfer circuit 7 while turning off the transfer circuit 8. Accordingly, when H level signals are input to the NAND circuit 4 from the NAND circuit 5 and the inverter 3, the NAND circuit 4 outputs an L-level mode setting determination signal. In addition, when L-level data is latched in the NAND circuits 4, 5, the NAND circuit 4 outputs an H-level mode setting determination signal.

Next, a case will be explained where the output signal A from the signal generation circuit 1 is set to the L level, that is, where ions are injected only into the transistor p2. In this case, since the transistor p1 is turned off while the transistor p2 is turned on, the output signal A is set to the L level. The L-level output signal A and the POWER-ON signal (L level) are input to the NOR circuit 2, which then outputs an H-level signal to set the output of the inverter 3 to the L level. Due to the input of the L-level signal, the NAND circuit 4 outputs an H-level signal. This H-level signal acts as the mode setting determination signal. Then, the L-level output signal is input to the NAND circuit 9, which then outputs an H-level output signal. On receiving the mode setting determination signal (H level) and the output signal (H level) from the NAND circuit 9, the NAND circuit 5 outputs an L-level signal. In addition, the NAND circuits 4, 5 latch the H-level signal.

As described above, by injecting ions into the transistor p1 or p2 of the signal generation circuit 1 to vary the VT, the mode setting determination signal can be set to the H or L level during power-up. As a result, ion injection enables the setting for the operation mode to be varied freely during power-up.

Next, a case will be described where the operation mode is changed after power-up.

To change the operation mode after power-up, the mode setting control signal is set to the L level. This operation turns off the transfer circuit 7 while turning on the transfer circuit 8. Then, the mode setting determination signal is changed by externally setting the mode setting signal to the H level (or L level). The NOR circuit 2 receives the POWER-ON signal bar to output an L-level signal. This L-level signal is inverted by the inverter 3, which then outputs an H-level signal. On receiving an L-level POWER-ON signal, the NAND circuit 9 outputs an H-level signal.

To set the mode setting determination signal to the H level, the mode setting signal is set to the L level. Then, two H-level signals are input to the NAND circuit 4, which then outputs an H-level signal. On the other hand, to set the mode setting determination signal to the L level, the mode setting signal is set to the H level. This operation causes the H-level signal from the inverter 3 and the H-level mode setting signal to be input to the NAND circuit 4, which then outputs an L-level signal.

Figure 2:
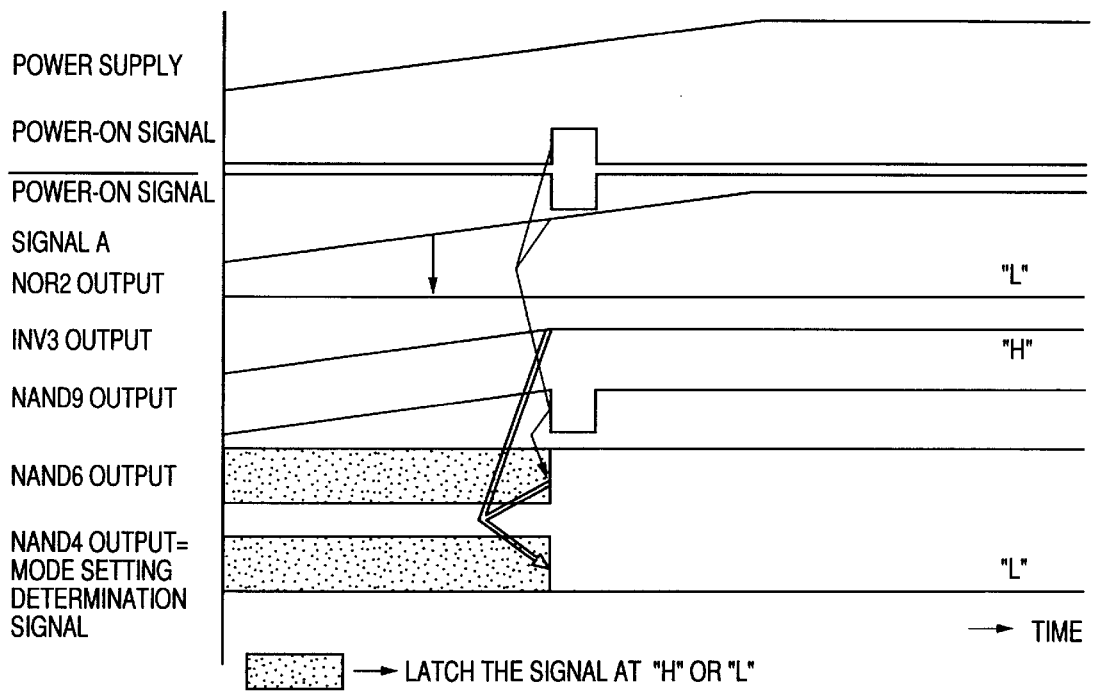
FIG. 2 is a timing chart showing an operation preformed when a mode setting determination signal is set to an L level during power-up.

FIG. 2 shows an operation performed when the mode setting determination signal is set to the L level during power-up. In this figure, INV denotes an inverter, NOR denotes a NOR circuit, and NAND denotes a NAND circuit, respectively. In FIG. 2, to set the mode setting determination signal to the L level during power-up, ions are injected only into the transistor p1 to set the output signal A from the signal generation circuit 1 to the H level. The H-level output signal A is input to the NOR circuit 2, which then generates an L-level output signal to set the output of the inverter 3 to the H level.

In addition, the H-level output signal A and the H-level POWER-ON signal are input to the NAND circuit 9, which then outputs an L-level signal. On receiving this L-level signal, the NAND circuit 5 outputs an H-level signal. Since the mode setting control signal is normally at the H level, the transfer circuit 7 is turned on, while the transfer circuit 8 is turned off. As a result, the H-level signal from the NAND circuit 5 and the H-level signal from the inverter 3 are applied to the NAND circuit 4, which then outputs an L-level signal. This output signal from the NAND circuit 4 acts as the mode setting determination signal. In addition, the NAND circuits 4, 5 latch the L-level signal as data.

Figure 3:
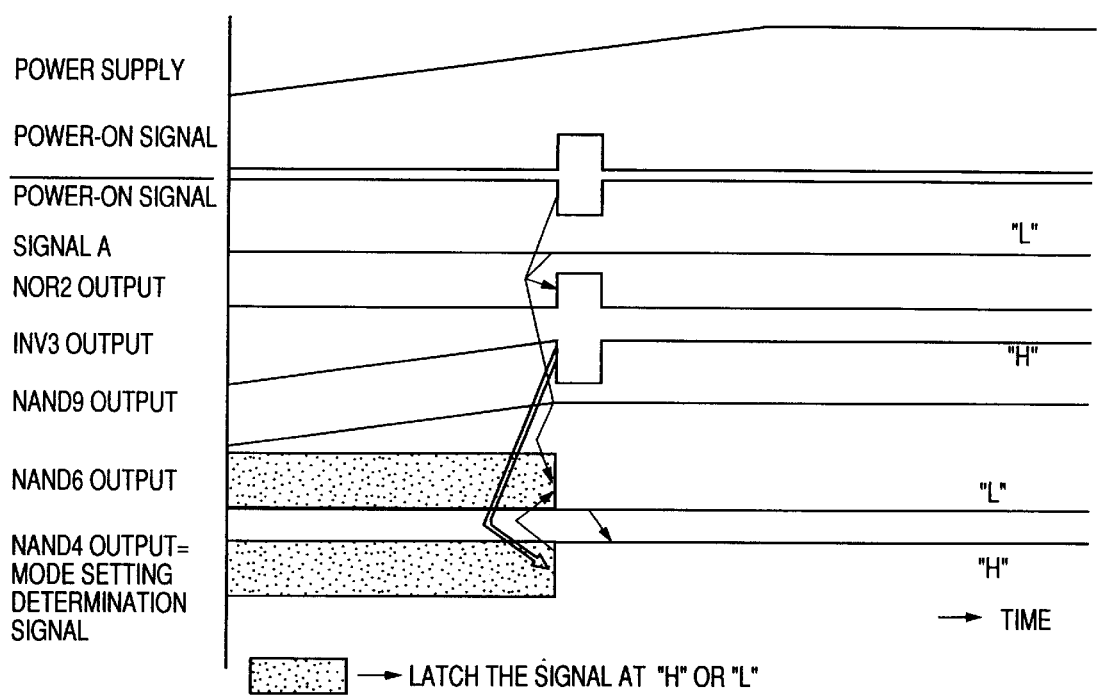
FIG. 3 is a timing chart showing an operation preformed when the mode setting determination signal is set to an H level during power-up.

FIG. 3 shows an operation performed when the mode setting determination signal is set to the H level during power-up.

In this case, ions are injected only into the transistor p2 to set the output signal A to the L level. The L-level output signal A and an L-level POWER-ON signal are input to the NOR circuit 2, which then outputs an H-level signal. Thus, the inverter 3 outputs an L-level signal. On receiving the L-level signal from the inverter 3, the NAND circuit 4 outputs an H-level signal. In addition, when the L-level output signal A is input to the NAND circuit 9, it outputs an H-level signal. Further, on receiving the H-level mode setting determination signal, the NAND circuit 5 outputs an L-level signal.

Figure 4:
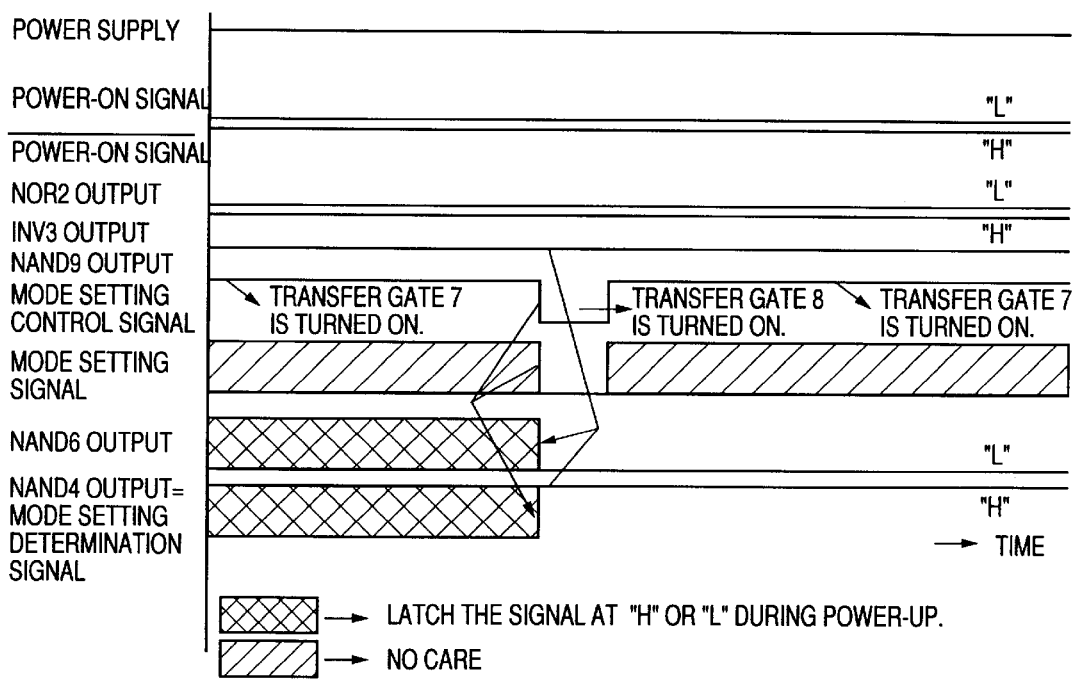
FIG. 4 is a timing chart showing an operation preformed when the mode setting determination signal is changed to the H level after power-up.

FIG. 4 shows an operation of the device preformed if the mode setting determination signal is changed to the H level after power-up. In this figure, to set the mode setting determination signal to the H level after power-up, the mode setting control signal is set to the L level. This operation turns off the transfer circuit 7 which turning on the transfer circuit 8. Then, when an externally provided mode setting signal is set to the L level, the NOR circuit 2 receives the POWER-ON signal bar (H level) to output an L-level output signal. This output signal is input to the inverter 3, which then outputs an H-level signal. In addition, due to the input of the L-level POWER-ON signal, the NAND circuit 9 outputs an H-level signal. When the mode setting signal is set to the L level, the NAND circuit 4 outputs an H-level signal.

Figure 5:
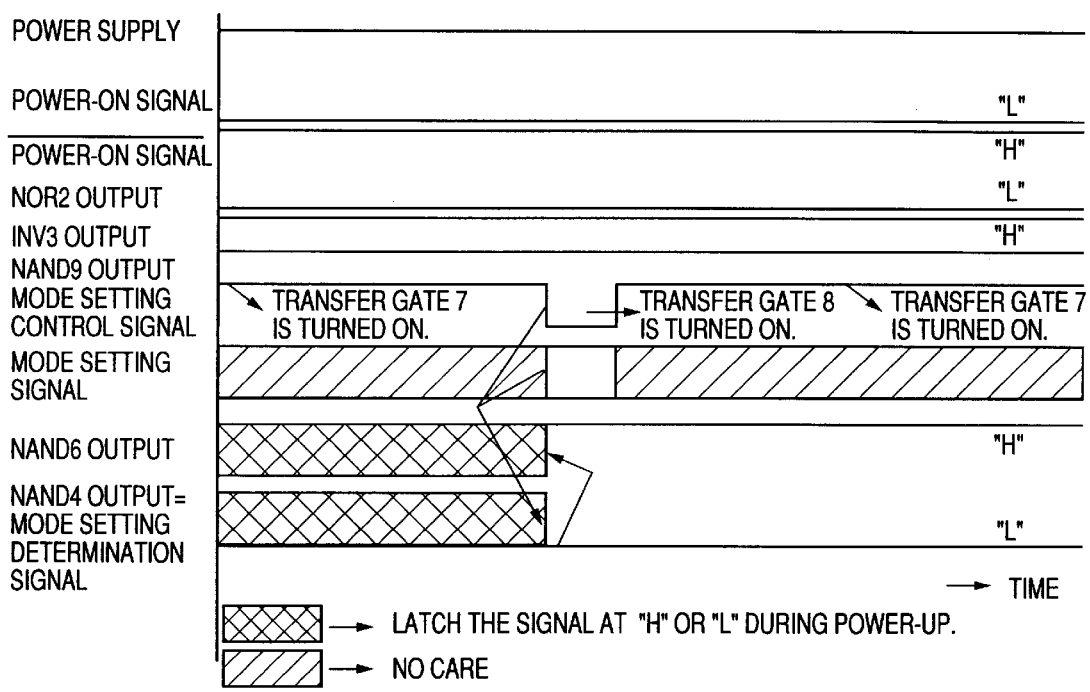
FIG. 5 is a timing chart showing an operation preformed when the mode setting determination signal is changed to the L level after power-up.

In addition, FIG. 5 shows an operation of the device preformed if the mode setting determination signal is changed to the L level. To set the mode setting determination signal to the L level after power-up, an externally provided mode setting control signal is set to the L level. This operation turns off the transfer circuit 7 which turning on the transfer circuit 8. Then, the mode setting signal is set to the H level. The NOR circuit 2 outputs an L-level signal when the H-level POWER-ON signal bar shown in FIG. 3 has been input thereto. This L-level signal is input to the inverter 3, which then outputs an H-level signal. In addition, on receiving the L-level POWER-ON signal, the NAND circuit 9 outputs an H-level signal to the NAND circuit 5.

Then, when the mode setting signal is set to the H level, this H-level signal is input to the NAND circuit 4 through the transfer circuit 8. The NAND circuit 4 outputs an L-level signal (mode setting determination signal) with logic based on the two input signals, that is, the H-level signal from the transfer circuit 8 and the H-level signal from the inverter 3.

Figure 6:
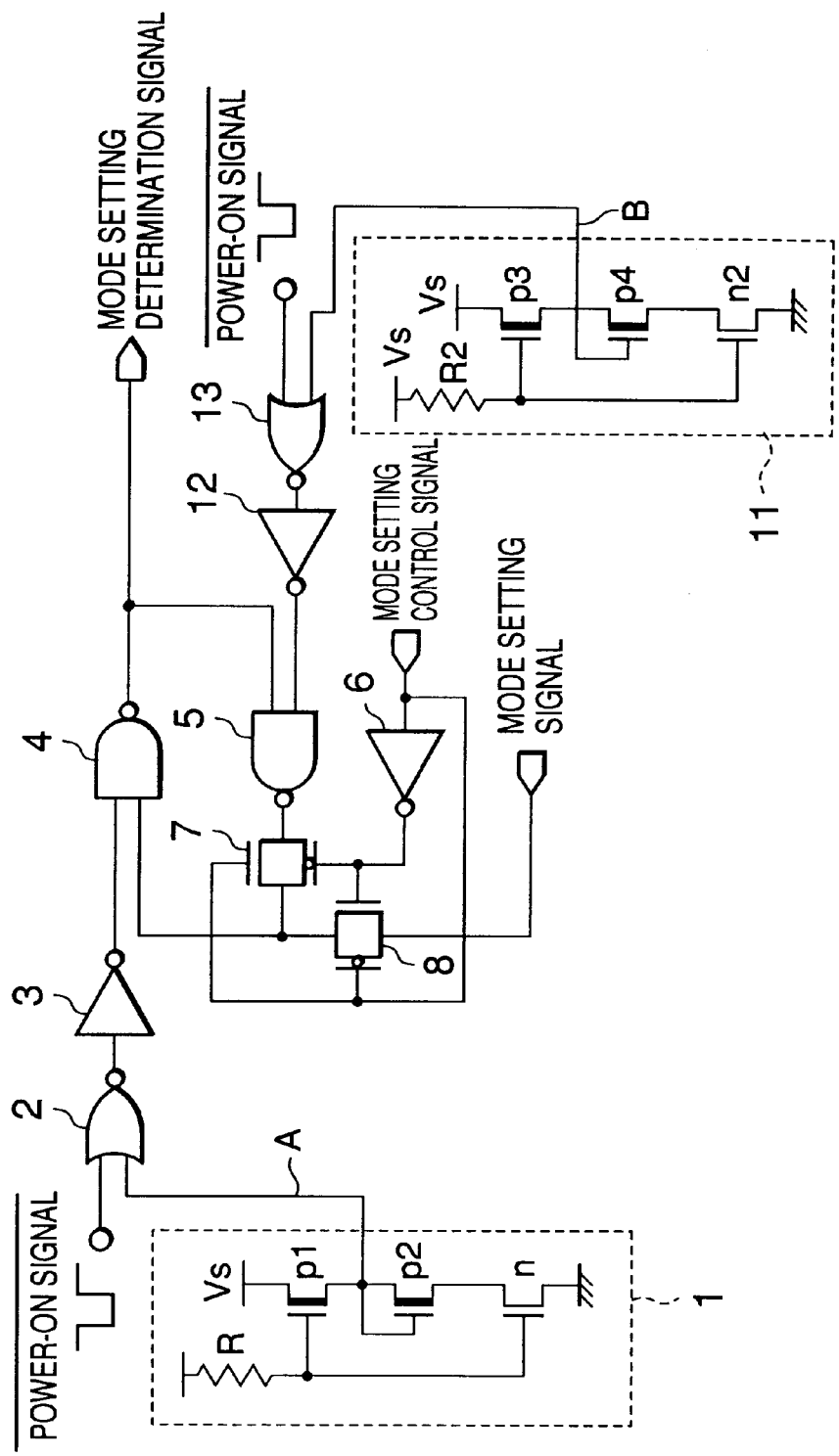
FIG. 6 is a circuit diagram showing a second embodiment of a semiconductor storage according to the present invention.

FIG. 6 shows a second embodiment of a semiconductor storage according to the present invention. This embodiment differs from the above described first embodiment in that it additionally includes a second signal generation circuit 11 configured identically to the signal generation circuit 1 and in that the NAND circuit 9 shown in FIG. 1 is replaced with an inverter 12 and a NOR circuit 13 that are connected in series. An output signal from the signal generation circuit 11 is delivered to one of the input signals of the NOR circuit 13. The other configuration is the same as in FIG. 1, and description thereof is therefore omitted. In the configuration of the signal generation circuit 11, the transistor p1 functionally corresponds to the transistor p3, the transistor p2 functionally corresponds to the transistor p4, the transistor n functionally corresponds to the transistor n2, and the resistor R functionally corresponds to the resistor R2.

Next, the initial setting for the operation mode during power-up according to the above described second embodiment will be described.

To set the mode setting determination signal to the L level, ions are injected only into the transistor p1 of the signal generation circuit 1 and into the transistor p4 of the signal generation circuit 11 to turn on the transistor p1. As a result, the transistor p2 of the signal generation circuit 1 is turned off, and the output signal A from the signal generation circuit 1 is set to the H level. In addition, the transistor p3 of the signal generation circuit 11 is turned off and the transistor p4 is turned on, so that an output signal B from the signal generation circuit 11 becomes the L level.

The H-level output signal A is input to the NOR circuit 2, which then outputs an L-level output signal. This output signal is inverted by the inverter 3, whereby an H-level signal is output from an output terminal of the inverter 3.

In addition, on receiving the L-level output signal B and the L-level POWER-ON signal bar, the NOR circuit 13 outputs an H-level signal. The H-level signal from the NOR circuit 13 is then inverted by the inverter 12, which then outputs an L-level signal. The NAND circuit 5 uses logic based on the H-level signal from the inverter 12 and the H-level signal from the NAND circuit 4 to output an L-level signal as the mode setting determination signal (L level). In addition, NAND circuits 4, 5 latch the L-level signal as data.

Next, to set the mode setting determination signal to the H level, ions are injected only into the transistor p2 of the signal generation circuit 1 and into the transistor p3 of the signal generation circuit 11. Then, the transistor p1 is turned off and the transistor p2 is turned on, whereby the output signal A from the signal generation circuit 1 is set to the L level. In addition, in the signal generation circuit 11, the transistor p3 is turned on and the transistor p4 is turned off, so that the output signal B from the signal generation circuit 11 becomes the H level.

Since the L-level output signal A and the L-level POWER-ON signal are input to the NOR circuit 2, the output signal from the NOR circuit 2 becomes the H level. The output signal from the NOR circuit 2 is inverted by the inverter 3, and consequently an L-level output signal is output.

Furthermore, due to the input of the H-level output signal B and the L-level POWER-ON signal, the NOR circuit 13 outputs an L-level signal. The inverter 12 inverts the H-level signal from the NOR circuit 13 and then outputs the inverted signal to the NAND circuit 5. The NAND circuit 4 outputs an H-level signal as the mode setting determination signal unless the output signal from the inverter 3 or both output signals from the transfer circuits 7, 8 are set to the H level. In addition, the NAND circuits 4, 5 latch the H-level signal as data.

Figures 7, 8:
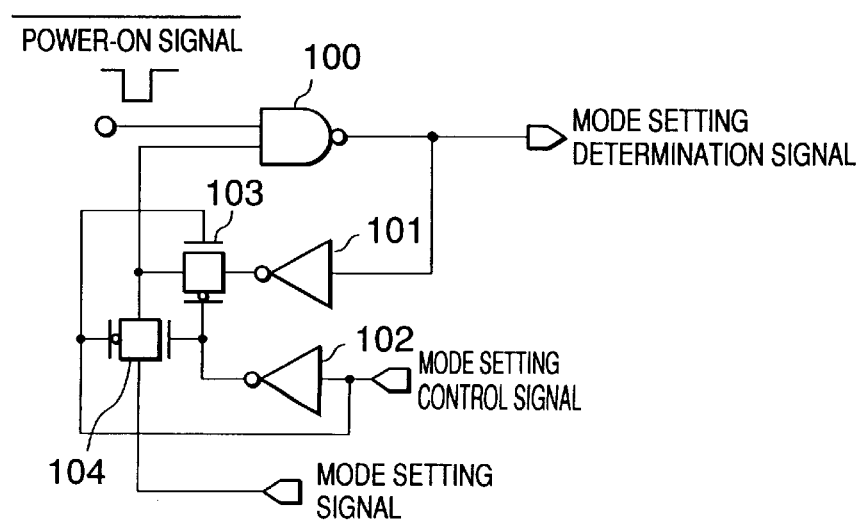
FIG. 7 is an explanatory drawing showing that a signal generation circuit 11 sets the mode setting determination signal in a plurality of manners during power-up according to the second embodiment of the present invention.
FIG. 8 is a circuit diagram showing a conventional mode setting determination signal generation circuit.
Figure 9:
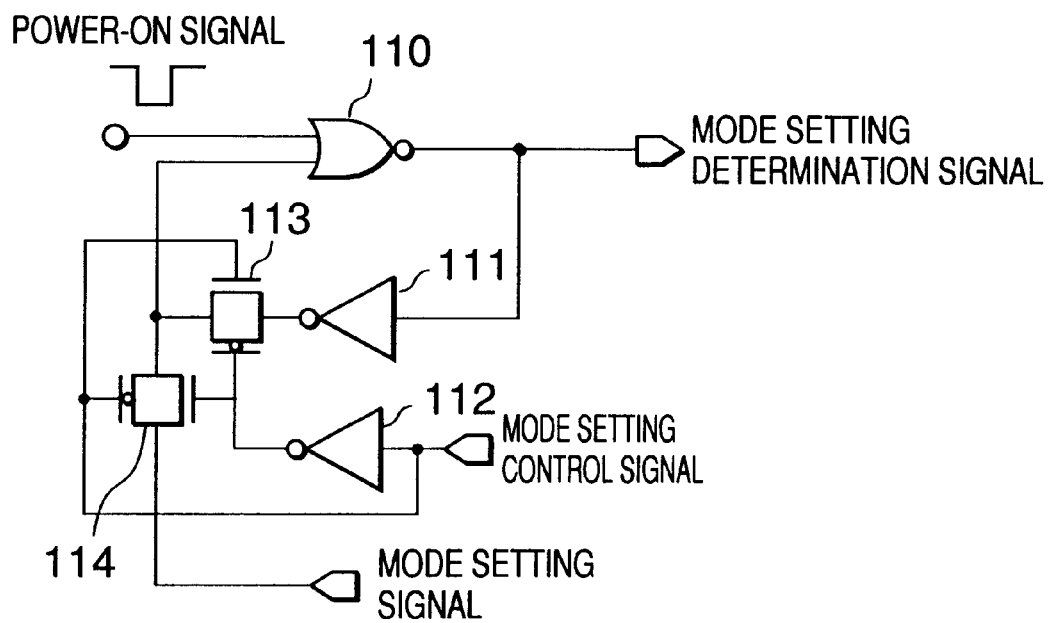
FIG. 9 is a circuit diagram showing another conventional mode setting determination signal generation circuit.

FIG. 7 shows that the signal generation circuit 11 can set mode setting determination signal in a plurality of manners during power-up.

As described above, the semiconductor storage according to the present invention has the signal generation means that can vary the output voltage by injecting ions into an internal semiconductor element to vary the voltage threshold, thereby allowing the initial setting for the operation mode to be changed during power-up. In addition, after power-up, the external signal can be used to vary various operation modes.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A mode setting determination signal generation circuit for generating a mode setting determination signal based on a power-on signal applied during power-up, comprising:

signal generation means for generating an output signal fixed either to a high or low level;

a first logic circuit section for outputting a signal based on a NOR or OR logic between the output signal from said signal generation means and said power-on signal;

a second logic circuit section for outputting a signal based on a NAND or AND logic between a power-on signal having a polarity opposite to that of said power-on signal and the output signal from said signal generation means;

a third logic circuit section for outputting a signal based on a NAND or AND logic between a signal at a mode setting determination signal output terminal thereof and the output signal from said second logic circuit section;

a transfer gate -circuit section for outputting either the output signal from said third logic circuit section or a mode setting signal as an output signal based on a mode setting control signal; and a fourth logic circuit section for outputting the signal the mode setting determination signal output terminal based on a NAND or AND logic between the output signal from said transfer gate circuit section and the output signal from said first logic circuit section.

2. The mode setting determination signal generation circuit according to claim 1, wherein said signal generation means has a first transistor and a second transistor connected in series between a first power supply and a second power supply, and said first and second transistors have different voltage thresholds.

3. The mode setting determination signal generation circuit according to claim 2, wherein ions are injected either into said first or second transistor to vary the voltage threshold of this transistor.

4. The mode setting determination signal generation circuit according to claim 1, wherein said signal generation means has an output voltage polarity that is opposite to an output signal level of said mode setting determination signal to be obtained.

5. The mode setting determination signal generation circuit according to claim 1 wherein at the time of changing said mode setting determination signal after power-up, said mode setting signal has an output signal level that is opposite to that of said mode setting determination signal to be obtained.

6. The mode setting determination signal generation circuit according to claim 1, wherein said second logic circuit section is a NAND gate.

7. The mode setting determination signal generation circuit according to claim 1, comprising:

second signal generation means for generating an output signal fixed either to a high or low level; and a fifth logic circuit section for obtaining NOR logic based on the output signal from said second signal generation means and on the power-on signal having a polarity opposite to that of said power-on signal.

8. The mode setting determination signal generation circuit according to claim 7, wherein said signal generation means has a first transistor and a second transistor connected in series between a first power supply and a second power supply, while said second signal generation means has a third transistor and a fourth transistor connected in series between said first power supply and said second power supply, and said first and second transistors have different voltage thresholds, while said third and fourth transistors have different voltage thresholds.

* * * * *